United States Patent
de la Cruz (10) Patent No.: US 11,399,447 B2
(45) Date of Patent: Jul. 26, 2022

(54) COLLAPSIBLE ASSEMBLIES FOR AIR FLOW CONTROL

(71) Applicant: Seagate Technology LLC, Cupertino, CA (US)

(72) Inventor: Angel Castillo de la Cruz, Pierce, CO (US)

(73) Assignee: Seagate Technology LLC, Fremont, CA (US)

( * ) Notice: Subject to any disclaimer, the term of this patent is extended or adjusted under 35 U.S.C. 154(b) by 336 days.

(21) Appl. No.: 16/795,881

(22) Filed: Feb. 20, 2020

(65) Prior Publication Data

US 2021/0267094 A1    Aug. 26, 2021

(51) Int. Cl.
*H05K 7/20* (2006.01)

(52) U.S. Cl.
CPC ..... *H05K 7/20736* (2013.01); *H05K 7/20145* (2013.01); *H05K 7/20172* (2013.01)

(58) Field of Classification Search
CPC .......... H05K 7/20736; H05K 7/20145; H05K 7/20172; G11B 33/08; G11B 33/142
See application file for complete search history.

(56) References Cited

U.S. PATENT DOCUMENTS

| | | | |
|---|---|---|---|
| 5,793,610 A | 8/1998 | Schmitt et al. | |
| 5,890,959 A | 4/1999 | Pettit et al. | |
| 5,921,862 A | 7/1999 | Ucciardi | |
| 6,005,770 A | 12/1999 | Schmitt | |
| 6,011,689 A | 1/2000 | Wrycraft | |
| 6,031,717 A | 2/2000 | Baddour et al. | |
| 6,174,232 B1 | 1/2001 | Stoll et al. | |
| 6,554,698 B2 | 4/2003 | Kranzdorf et al. | |
| 6,705,833 B2 | 3/2004 | Tam et al. | |
| 6,837,785 B2 | 1/2005 | Soderlund | |
| 7,025,086 B2 | 4/2006 | Maeda et al. | |
| 7,302,967 B2 * | 12/2007 | Maeda | F24F 13/15 137/512.1 |
| 7,908,879 B1 * | 3/2011 | Chen | F24F 1/0041 62/259.1 |
| 8,007,228 B2 * | 8/2011 | Wang | F24F 13/075 415/48 |
| 8,057,161 B2 | 11/2011 | Seidler | |
| 8,414,368 B2 | 4/2013 | Hansen et al. | |
| 8,851,831 B2 | 10/2014 | Sun | |
| 8,897,009 B2 | 11/2014 | Janes et al. | |
| 9,777,736 B2 | 10/2017 | Shih et al. | |
| 9,938,990 B2 * | 4/2018 | Amin-Shahidi | F04D 25/14 |
| 10,420,250 B2 | 9/2019 | Fuke et al. | |
| 2003/0168103 A1 | 9/2003 | Onstenk et al. | |
| 2004/0060593 A1 | 4/2004 | Onstenk et al. | |
| 2004/0129410 A1 | 7/2004 | Soderlund | |

(Continued)

*Primary Examiner* — Emmanuel E Duke
(74) *Attorney, Agent, or Firm* — Faegre Drinker Biddle & Reath LLP (57) ABSTRACT

A cooling assembly includes an air mover assembly including an inlet. The cooling assembly further includes an air management assembly that is coupled to the air mover assembly and that includes circular components arranged concentrically with respect to each other such that the circular components can move between an open position and a closed position. In the open position, the circular components have gaps between each other. In the closed position, the circular components reduce or eliminate the gaps between each other.

20 Claims, 9 Drawing Sheets

(56) References Cited

U.S. PATENT DOCUMENTS

| | | |
|---|---|---|
| 2007/0134110 A1 | 6/2007 | Lin et al. |
| 2008/0233861 A1 | 9/2008 | Jenkins et al. |
| 2011/0028081 A1 | 2/2011 | Hopkins et al. |
| 2011/0259550 A1 | 10/2011 | Komaba et al. |
| 2012/0190289 A1 | 7/2012 | Wei |
| 2013/0258591 A1 | 10/2013 | Sun et al. |
| 2013/0324025 A1* | 12/2013 | Peng .................... H05K 5/0213 |
| | | 415/223 |
| 2017/0042061 A1 | 2/2017 | Chen et al. |

* cited by examiner

COLLAPSIBLE ASSEMBLIES FOR AIR FLOW CONTROL

SUMMARY

In certain embodiments, a cooling assembly includes an air mover assembly including an inlet. The cooling assembly further includes an air management assembly that is coupled to the air mover assembly and that includes circular components arranged concentrically with respect to each other such that the circular components can move between an open position and a closed position. In the open position, the circular components have gaps between each other. In the closed position, the circular components reduce or eliminate the gaps between each other.

In certain embodiments, a system includes a first cooling assembly with a first air mover assembly, which includes a first air mover. The first cooling assembly includes a first management assembly that is coupled to the first air mover assembly. The first management assembly has a first group of circular components arranged concentrically with respect to each other such that the first group of circular components can move between an open position to allow air to pass through the first management assembly and a closed position to reduce backflow through the first management assembly.

In certain embodiments, a method is disclosed for using a cooling assembly, which includes an air management assembly that is coupled to an air mover. The air management assembly has circular components arranged concentrically with respect to each other and can move between an open position and a closed position. The method includes powering the air mover to pull air through gaps between the circular components of the air management assembly in the open position. The method further includes moving the air management assembly to the closed position such that the circular components couple to each other to reduce or eliminate the gaps between each other.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope the appended claims.

DETAILED DESCRIPTION

Data storage systems utilize cooling devices such as air movers (e.g., fans, blowers) to keep components of the data storage systems within a desired operating range. However, air movers generate undesirable acoustic energy that may be transmitted throughout the system and that affects performance of data storage devices housed within the system. Further, when one of the air movers fails, the total volume of air flow is reduced, and the failed air mover exposes an open circuit through which unwanted backflow of air can enter the data storage systems. This open circuit can further reduce the total volume of air flow within the data storage system. Currently, to compensate for the reduced air flow, data storage systems increase the speed at which the still-functioning air movers rotate and/or use motorized mechanisms to close the open circuit. However, these approaches require that the failure be detected (which may require additional components like sensors), require motorized mechanisms, and/or assume that increasing the speed of the other air movers can adequately compensate for the reduced air flow until the failed air mover can be replaced by a functioning air mover. Certain embodiments of the present disclosure are accordingly directed to approaches for helping to prevent backflow of air when air movers fail or otherwise malfunction and/or approaches for reducing the amount of acoustic energy that is transmitted within data storage systems.

Figure 1:
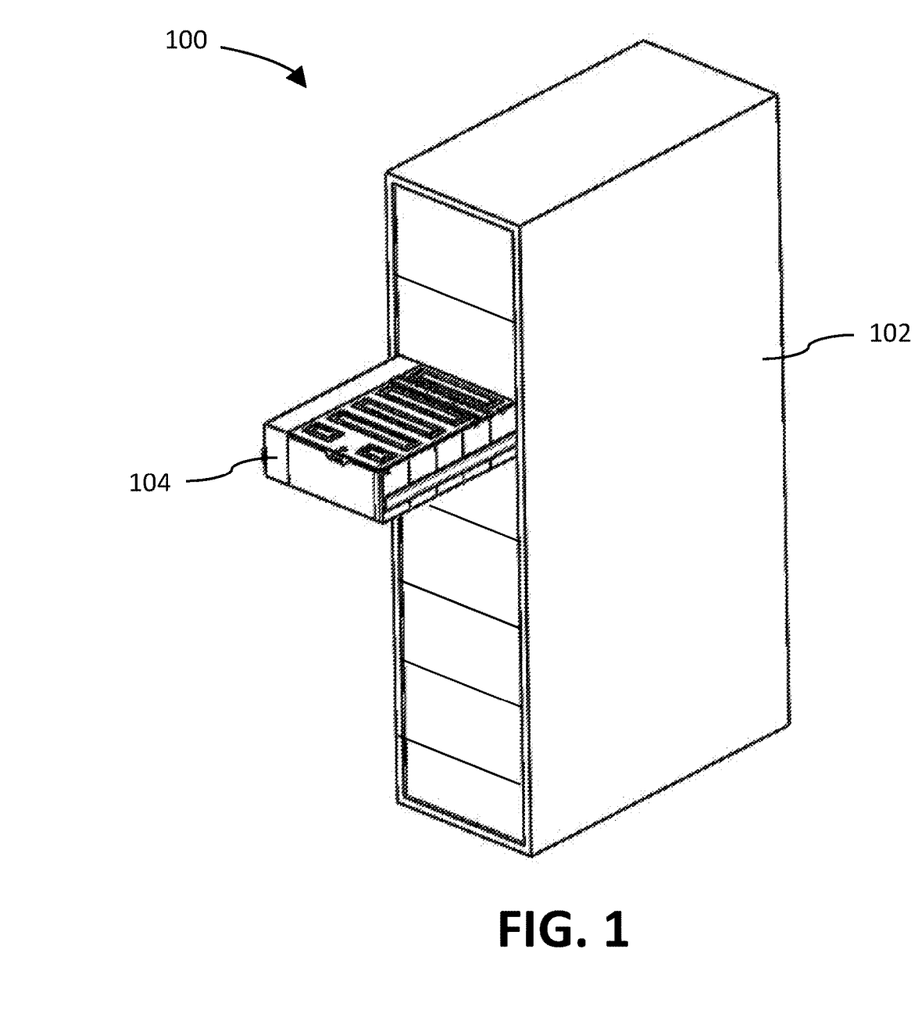
FIG. 1 shows a perspective view of a data storage system, in accordance with certain embodiments of the present disclosure.

FIG. 1 shows a data storage system 100 including a rack 102 (e.g., a cabinet) with a plurality of enclosures 104. Each enclosure 104 can include multiple drawers or storage levels (each of which may be considered separate enclosures or sub-enclosures) that house electronic devices such as data storage devices installed within the drawers or storage levels. Each enclosure 104 itself can be arranged in a drawer-like fashion to slide into and out of the rack 102, although the enclosures 104 are not necessarily arranged as such.

Figure 2:
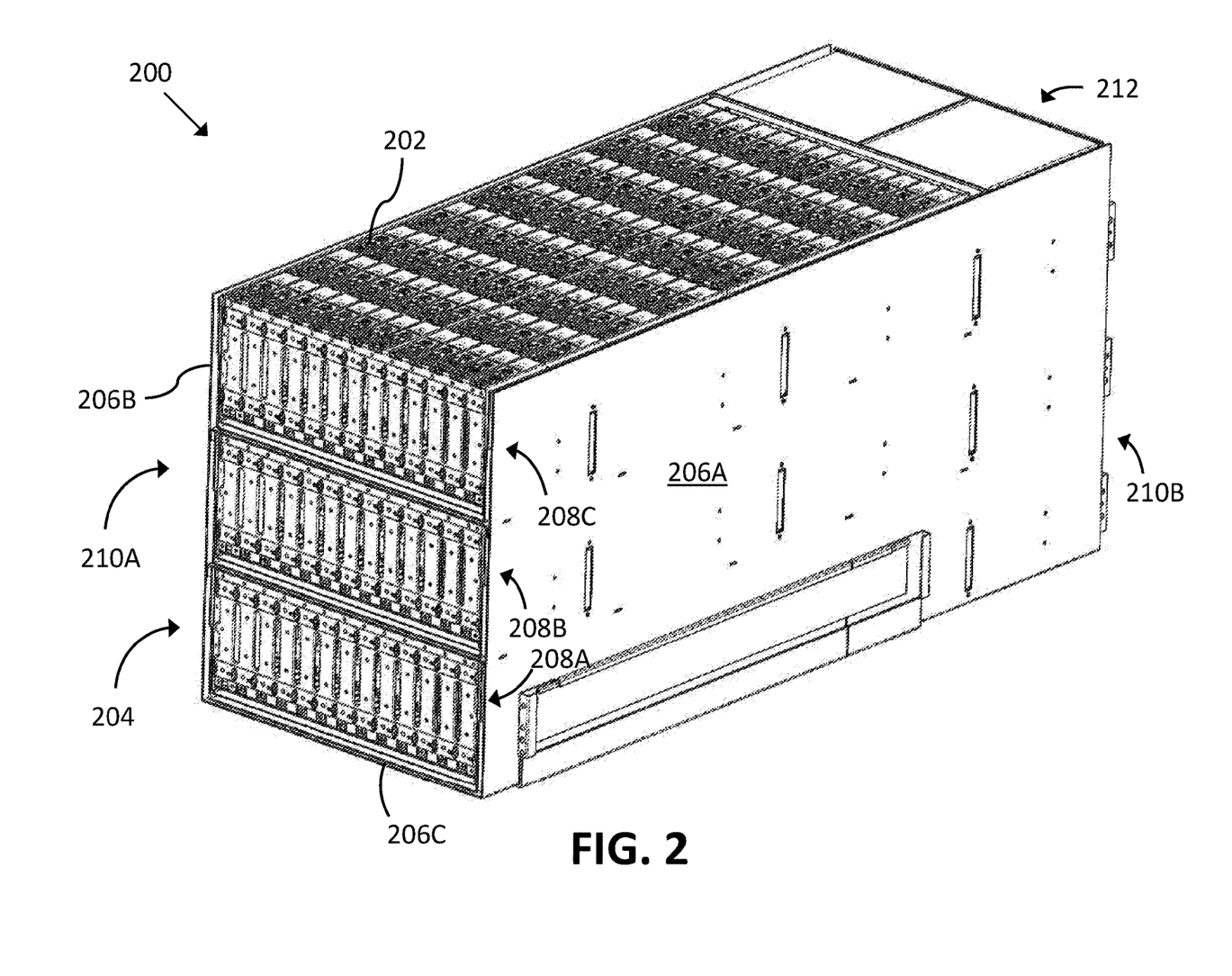
FIG. 2 shows a perspective view of an enclosure, in accordance with certain embodiments of the present disclosure.

FIG. 2 shows an enclosure 200, which can be utilized in a data storage system such as the data storage system 100 of FIG. 1. For example, a rack—such as the rack 102 in FIG.

1—can include multiple individual enclosures, such as the enclosure 200. The enclosure 200 is arranged to secure data storage devices 202 (e.g., hard disk drives and/or solid position drives), various electronics (e.g., power supplies), and cooling devices (e.g., air movers) among other things.

The enclosure 200 includes a chassis 204 with a first side wall 206A, a second side wall 206B, and a bottom wall 206C. The chassis 204 may also include front and rear walls along with a top cover to enclose the data storage devices 202 within the enclosure 200. As shown in FIG. 2, the enclosure 200 can include multiple data storage levels 208A-C each with multiple rows of data storage devices 202. Each data storage level 208A-C may be arranged to slide into and out of the enclosure 200 in a drawer-like fashion. Further, each data storage level 208A-C can form its own enclosure such that the enclosure 200 can be considered to include multiple, smaller enclosures arranged to slide into and out of the enclosure 200. The enclosure 200 includes a front end 210A and a back end 210B with a cooling area 212 at the back end 210B of the enclosure 200.

Figure 3:
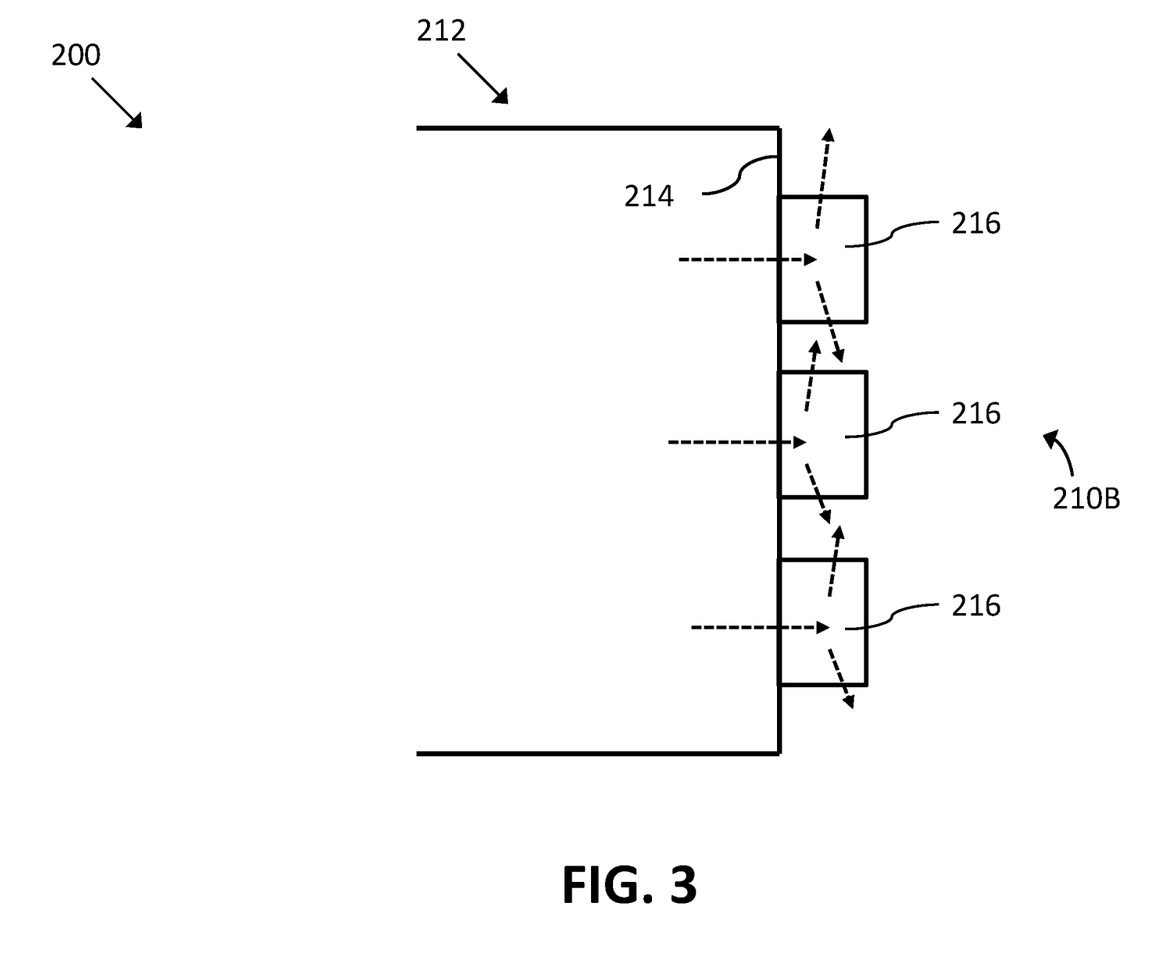
FIG. 3 shows a partial, cutaway view of a back end of the enclosure of FIG. 2, in accordance with certain embodiments of the present disclosure.

FIG. 3 shows a cutaway, schematic side view of the back end 210B of the enclosure 200. The enclosure 200 includes a back wall 214 on which several cooling assemblies 216 are positioned. Exemplary cooling assemblies and their various features are shown in FIGS. 4-10 and described in additional detail below. In short, the cooling assemblies 216 are arranged to pull air from the front end 210A of the enclosure 200 towards the back end 210B of the enclosure 200. As the air moves within the enclosure 200, the air cools the various electronic devices positioned within the enclosure 200. The cooling assemblies 216 shown in FIG. 3 are coupled to the back wall 214 of the enclosure 200 such that all or a majority of each of the cooling assemblies 216 is positioned outside the enclosure 200. The dotted arrows in FIG. 3 represent air flowing into the cooling assemblies 216 from the interior of the enclosure 200 and exiting the cooling assemblies 216 along generally radial directions.

Figure 4:
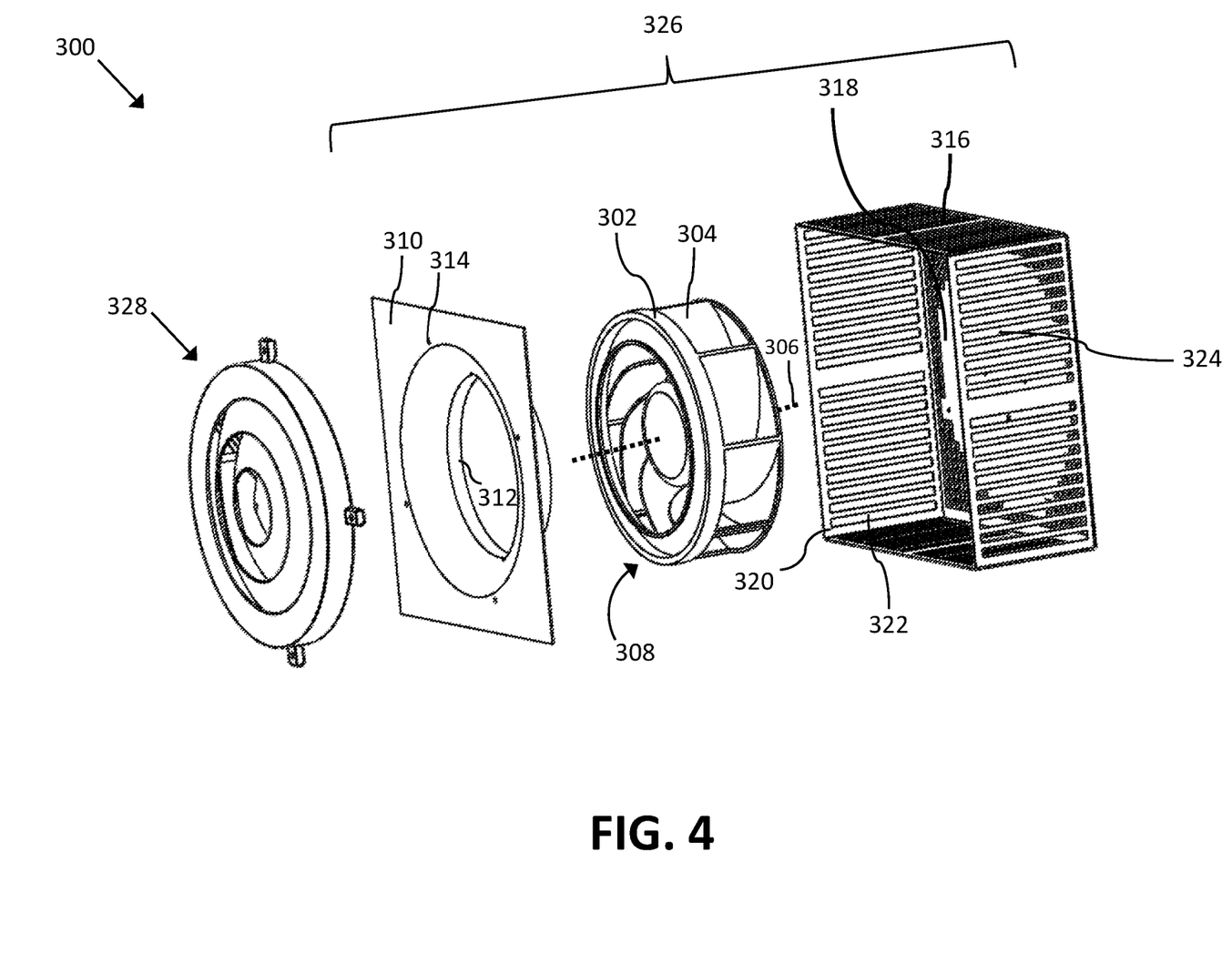
FIG. 4 shows an exploded, perspective view of a cooling assembly, in accordance with certain embodiments of the present disclosure.

FIG. 4 shows an exploded view of a cooling assembly 300, which can be installed in an enclosure such as the enclosure 104 of FIG. 1 and enclosure 200 of FIGS. 2 and 3.

The cooling assembly 300 includes an air mover 302 (e.g., a fan unit such as a radial blower unit or an axial fan unit; a blower). The air mover 302 can include blades 304 shaped such that—when the blades 304 rotate around a rotation (or inlet) axis 306 (shown in dotted lines in FIG. 4)—the blades 304 pull air through an inlet side 308 of the air mover 302 and exhaust the air radially from the rotation axis 306. As such, when the cooling assembly 300 is installed to an enclosure like the cooling assemblies 216 of FIG. 3, the air is pulled from inside the enclosure 200 and exhausted in a radial direction outside the enclosure. In certain embodiments, the air mover is a radial blower unit, which may be able to exhaust a larger volume of air for a given amount of power compared to air movers that are axial fans. The air mover 302 can include a motor that is electrically coupled to a power supply in an enclosure and that is coupled to the blades 304 to rotate the blades 304.

The cooling assembly 300 includes a member such as a front cover 310 with an inlet opening 312 and front mounting holes 314. When the cooling assembly 300 is assembled, the front cover 310 can be coupled to (e.g., clipped to, fastened to) another member such as a back cover 316. The back cover 316 includes a back wall 318 and four side walls 320 with exhaust openings 322 throughout the side walls 320. Although the back cover 316 is shown as including the side walls 320 and the exhaust openings 322, the front cover 310 could include side walls and exhaust openings instead of or in addition to those of the back cover 316. Alternatively, a separate component could be coupled between the front cover 310 and the back cover 316 and include exhaust openings, etc. The back cover 316 also includes rear mounting holes 324. The air mover 302 can be coupled to the back cover 316 via fasteners that extend through one or more of the rear mounting holes 324 and couple to holes in the air mover 302. In certain embodiments, the air mover 302, the front cover 310, and the back cover 316 can be assembled to create an air mover assembly 326. The cooling assembly 300 also includes an air management assembly 328 that is coupled to the air mover assembly 326 (e.g., coupled to the front cover 310).

Figure 5:
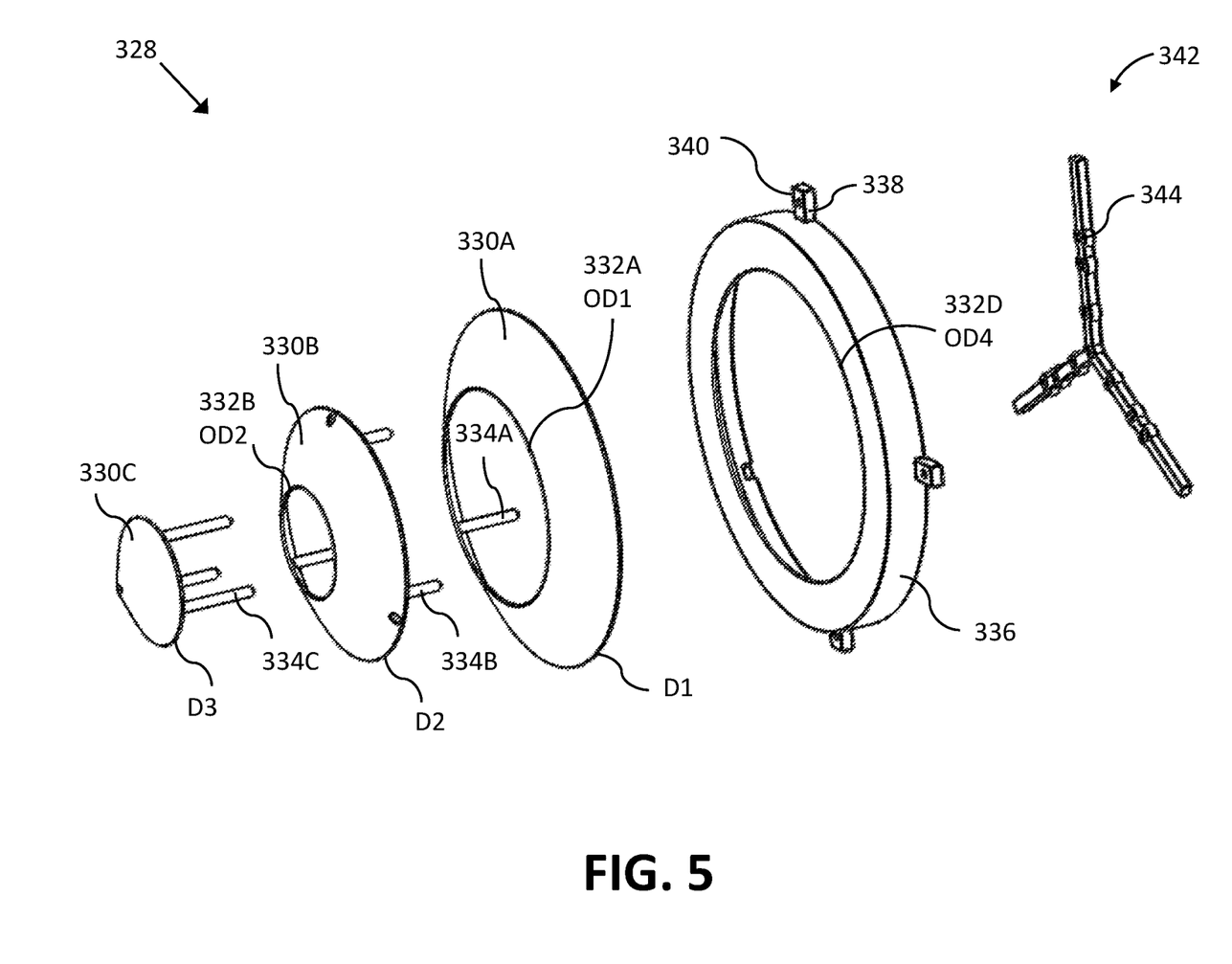
FIG. 5 shows a partially exploded, perspective view of portions of the cooling assembly of FIG. 4, in accordance with certain embodiments of the present disclosure.

FIG. 5 shows an exploded view of components of the air management assembly 328. In certain embodiments, the air management assembly 328 includes one or more air-guide members 330A-C. Although the air-guide members 330A-C are shown as being circular-shaped or disc-shaped components, the air-guide members 330A-C can be different shapes such as triangular-shaped or hex-shaped. Further, although three air-guide members 330A-C are shown, in other embodiments, the air management assembly 328 includes two, four, five, or more air-guide members 330A-C. Because the air-guide members 330A-C are shown in the figures as being circular-shaped, the air-guide members 330A-C will be referred to as the following: a first circular component 330A, a second circular component 330B, and a third circular component 330C. As will be described in more detail below, the air management assembly 328—and, more particularly, the circular components 330A-C—can move between an open position in which air can pass through gaps between the circular components 330A-C and a closed position in which backflow of air is reduced or otherwise blocked because the gaps between the circular components 330A-C are reduced or otherwise eliminated.

The first circular component 330A has a first outer diameter D1 and a first opening 332A with a first opening diameter OD1 (which may also be referred to as the first inner diameter). As such, the first circular component 330A can be considered to be ring-shaped, which can include circular and non-circular shapes. The second circular component 330B has a second outer diameter D2 and a second opening 332B with a second opening diameter OD2 (which may also be referred to as the second inner diameter). As such, the second circular component 330B can be considered to be ring-shaped. The third circular component 330C has a third outer diameter D3. The third circular component 330C can have a leading surface that is flat, truncated cone-shaped, truncated pyramidal-shaped, in addition to being a full cone or pyramid.

FIG. 5 shows the circular components 330A-C as including one or more legs 334A-C. For example, the first circular component 330A can include a first group of legs 334A, the second circular component 330B can include a second group of legs 334B, and the third circular component 330C can include a third group of legs 334C. As will be described in more detail below, the legs 334A-C can help guide and position the circular components 330A-C as the air management assembly 328 moves between the open position and the closed position. Although each circular component 330A-C is shown as including multiple legs, in certain embodiments, the circular components 330A-C are slidably coupled to a central shaft or rod, which help guides or maintains the position of the circular components 330A-C as the air management assembly 328 moves between the open position and the closed position.

The air management assembly 328 can further include a ring 336 (e.g., a retention ring) that is coupled to the front cover 310. The ring 336 is shown in FIG. 5 as including tabs 338 with holes 340 through which fasteners can extend to couple the ring 336 (and therefore the air management assembly 328) to the front cover 310 (and therefore to the air mover assembly 326). The ring 336 has a fourth opening 332D with a fourth opening diameter OD4. As will be described in more detail below, the ring 336 helps retain the circular components 330A-C when the air management assembly 328 is in the closed position.

The air management assembly 328 can further include a stopper structure 342. In certain embodiments, the stopper structure 342 includes an opening 344 for each of the legs 334A-C. The legs 334A-C extend through the openings 344 such that the respective circular components 330A-C can slide within the openings 344 and the air management assembly 328 moves between the open position and the closed position. With the legs 334A-C positioned within the openings 332, the stopper structure 342 helps maintain the concentric position of the circular components 330A-C with respect to each other. When the air management assembly 328 is in the open position, the circular components 330A-C rest on the stopper structure 342 to maintain the position of the circular components 330A-C along the rotation axis 306.

Figure 6:
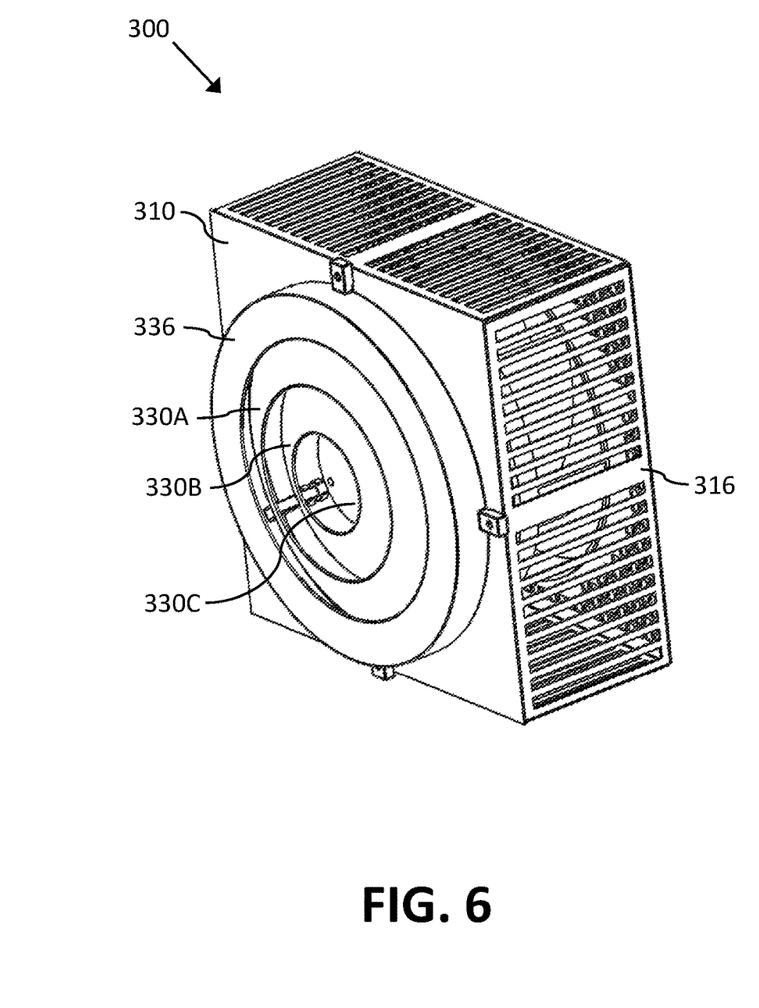
FIG. 6 shows a perspective view of an inlet side of the cooling assembly of FIGS. 4 and 5 in an open position, in accordance with certain embodiments of the present disclosure.
Figure 7:
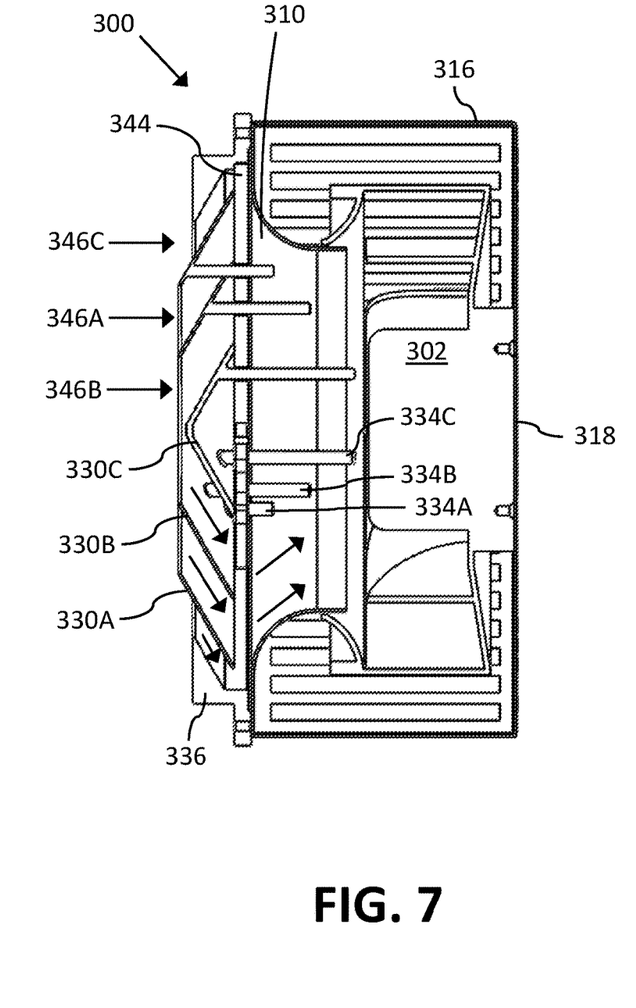
FIG. 7 shows a side, cut-away view of the cooling assembly of FIGS. 4-6 in the open position, in accordance with certain embodiments of the present disclosure.

FIGS. 6 and 7 show the cooling assembly 300 with the air mover assembly 326 and the air management assembly 328 coupled to each other. The air management assembly 328 is shown in the open position.

In the open position, the circular components 330A-C are spaced from each other such that air can pass through gaps between respective circular components 330A-C. For example, in the open position shown in FIG. 7, the air management assembly 328 has a first gap 346A between the first circular component 330A and the second circular component 330B, a second gap 346B between the second circular component 330B and the third circular component 330C, and a third gap 346C between the first circular component 330A and the ring 336. The circular components 330A-C are shaped (e.g., angled) such that air passing through the gaps 346A-C is directly radially outward as the air passes through the gaps 346A-C (as denoted by arrows in FIG. 7). For example, the circular components 330A-C can be cone-shaped. After passing through the gaps 346A-C, the air is then directed radially inward as the air passes through the inlet opening 312 of the front cover 310. In certain embodiments, the total area of the gaps 346A-C is greater than the area of the inlet opening 312 of the front cover 310.

As shown in FIGS. 5-7, the circular components 330A-C are arranged to be concentric with each other. For example, the third circular component 330C is shown as being the innermost circular component, which is adjacent to and concentric with the second circular component 330B, which is adjacent to and concentric with the first circular component 330A. In the open position, the outermost circular component (i.e., the first circular component 330A in the example of FIG. 7) surrounds the other circular components (i.e., the second circular component 330B, which surrounds the third circular component 330C in the example of FIG. 7).

In addition to managing air flow through the cooling assembly 300, the air management assembly 328 helps reduce the amount of acoustic energy that is transferred to enclosures from the air mover 302. As the air mover 302 operates, the air mover 302 generates acoustic energy (e.g., energy transmitted through air), which can affect the performance of data storage devices. When acoustic energy is transmitted to data storage devices, the data storage devices vibrate which affects their ability to write data and read data. For data storage devices that are hard disk drives, the vibration resulting from acoustic energy makes it difficult for the read/write heads in the hard disk drives to settle on or follow a desired data track for data reading and data writing operations. The risk of acoustic energy affecting performance increases as hard disk drives store more data per disk and therefore require finer positioning of the read/write heads.

Figure 8:
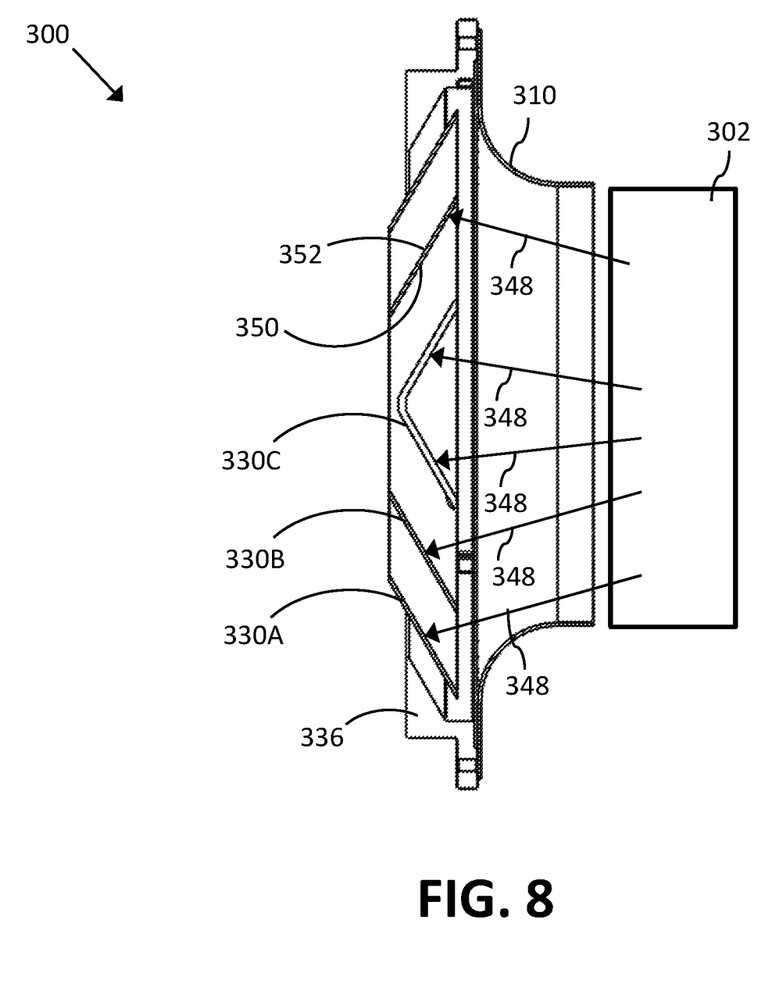
FIG. 8 shows a side, cut-away view of a portion of the cooling assembly of FIGS. 4-7 in the open position, in accordance with certain embodiments of the present disclosure.

As best seen in FIG. 8, the circular components 330A-C of the air management assembly 328 in the open position help block or otherwise reduce the effect of acoustic energy 348 (represented in FIG. 8 by arrows with dashed lines) generated by the air mover 302. As shown in FIG. 8, the acoustic energy 348 generated by the air mover 302 is directed in various directions, including towards the inlet opening 312 of the air management assembly 328. When the acoustic energy 348 contacts one of the circular components 330A-C (e.g., a surface 350 on the exhaust side of the circular components 330A-C), the amount of the acoustic energy 348 decreases.

As shown in FIG. 8, in certain embodiments, given the arrangement of the circular components 330A-C with respect to each other and the angled surfaces 350 of the circular components 330A-C in the open position, the acoustic energy 348 does not have a straight path from the air mover 302 through the air management assembly 328. Put another way, the acoustic energy 348 has only indirect paths through the air management assembly 328 to reach the inside of an enclosure. As such, the acoustic energy 348 contacts at least one circular component 330A-C before exiting the air management assembly 328. In certain embodiments, the acoustic energy 348 first contacts one of the surfaces 350 and is deflected towards another surface 352 on the inlet side of the circular components 330A-C. The overall amount of acoustic energy 348 is reduced as the acoustic energy 348 further contacts and is deflected by the circular components 330A-C. In certain embodiments, the circular components 330A-C include materials that dampen or attenuate the acoustic energy 348 rather than amplify the acoustic energy 348. In certain embodiments, such materials include plastic-based or foam-based materials.

Figure 9:
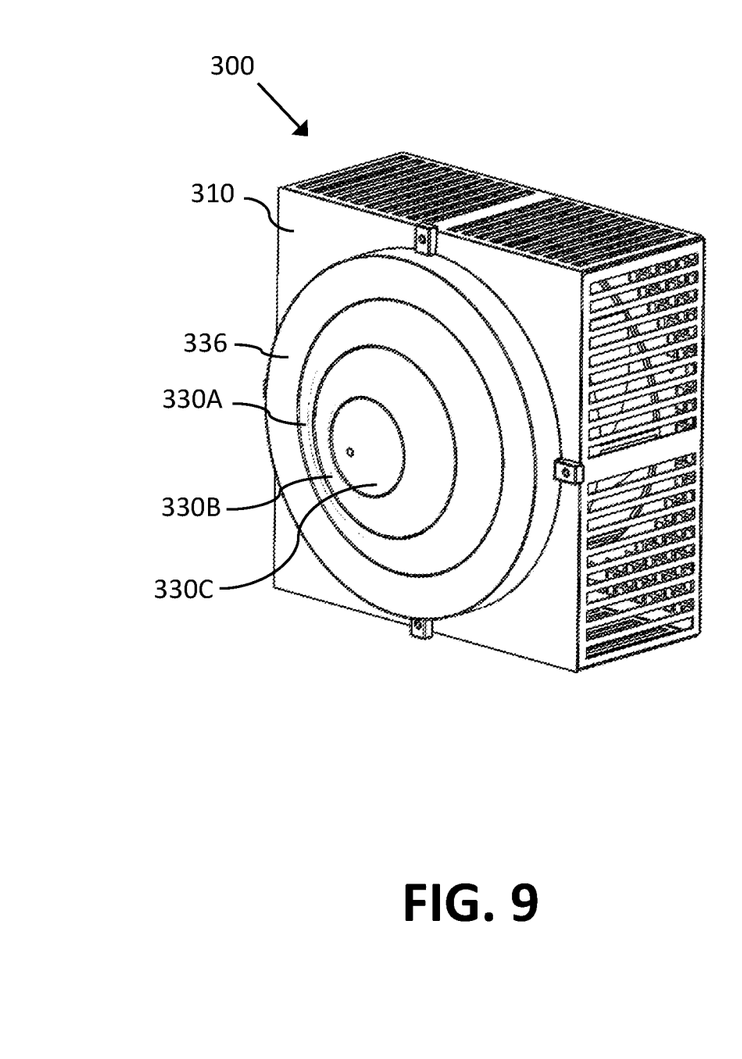
FIG. 9 shows a perspective view of an inlet side of the cooling assembly of FIGS. 4-8 in a closed position, in accordance with certain embodiments of the present disclosure.
Figure 10:
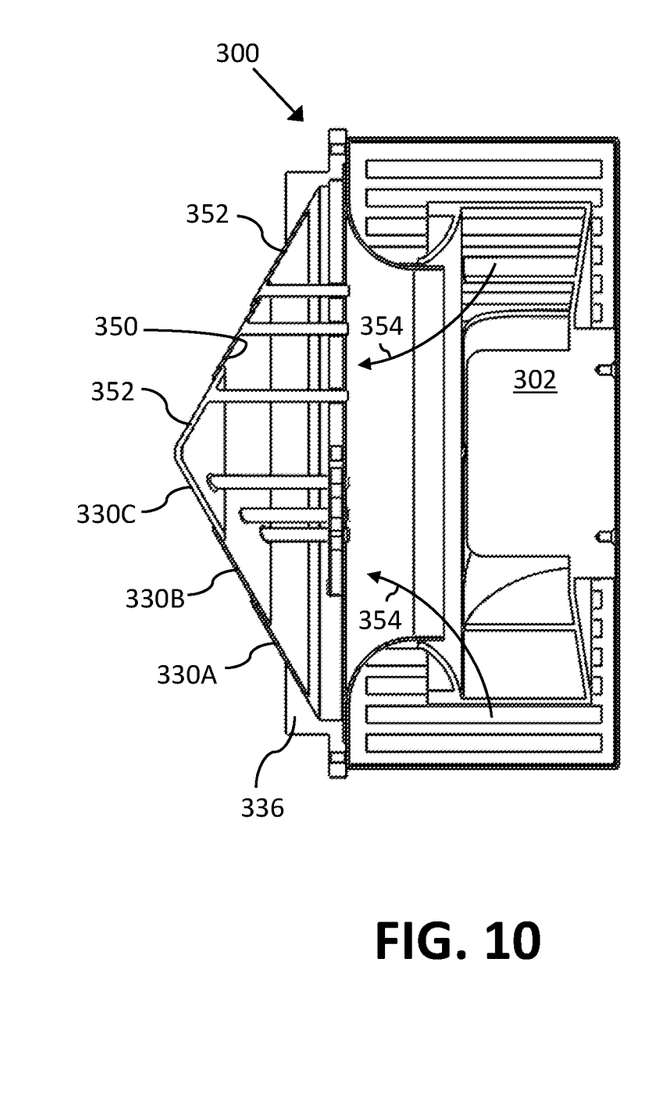
FIG. 10 shows a side, cut-away view of the cooling assembly of FIGS. 4-9 in a closed position, in accordance with certain embodiments of the present disclosure.

FIGS. 9 and 10 show the cooling assembly 300 with the air mover assembly 326 and the air management assembly 328 coupled to each other. The air management assembly 328 is shown in the closed position. In the closed position, the air mover 302 has malfunctioned or is otherwise not operating to its full capability such that air 354 (represented with arrows) is entering—instead of exiting—the cooling assembly 300 through the exhaust openings 322. For example, if an enclosure includes multiple cooling assemblies 300, the cooling assemblies 300 operating will create a negative pressure through the cooling assemblies 300 not operating.

In the closed position, the circular components 330A-C are arranged such that the circular components 330A-C reduce or eliminate the gaps 346A-C that existed in the open position such that little to none of the air 354 passes between the circular components 330A-C and into an enclosure. For example, the circular components 330A-C can be coupled to each other such that the air 354 cannot pass between the circular components 330A-C. This reduction or elimination of the gaps 346A-C occurs because, with the air mover 302 not operating properly, the air 354 backflowing into the cooling assembly 300 impinges on the surfaces 350 of the circular components 330A-C and causes the circular components 330A-C to shut upon each other. Put another way, as the air 354 impinges on the surfaces 350 of the circular components 330A-C, the circular components 330A-C are shifted further away along the rotation axis 306 from the air mover 302. The extent the circular components 330A-C are shifted is limited because the respective outer diameters of the inner circular components are larger than the corresponding opening diameters of the respective outer circular components. For example, the third outer diameter D3 of the third circular component 330C is larger than the second opening diameter OD2. As such, a portion of the third circular component 330C overlaps with and contacts a portion of the second circular component 330B. Put another way, portions of an inlet-side surface 352 of the third circular component 330C contact portions of the exhaust-side surface 350 of the second circular component 330B. As another example, the second outer diameter D2 of the second circular component 330B is larger than the first opening diameter OD1. And, the first outer diameter D1 of the first circular component 330A is larger than the fourth opening diameter OD4 of the fourth opening 332D of the ring 336.

As shown in FIGS. 9 and 10, when the air management assembly 328 is in the closed position, the circular components 330A-C form a cone or pyramid shape with the third circular component 330C (i.e., the innermost circular component in the example of FIG. 10) being shifted the farthest from the air mover 302 followed by the second circular component 330B and the first circular component 330A. As shown in FIG. 10, the inlet-side surface 352 of the first circular component 330A contacts the ring 336 such that the first circular component 330A (and therefore the other circular components 330B and 330C) are retained or otherwise coupled to the air management assembly 328.

The cooling assembly 300 shown in the figures and described above provides approaches for limiting the back flow of air through the cooling assembly 300 in the event the air mover 302 fails or misfunctions. The cooling assemblies 300 can include circular components 330A-C that open and close (e.g., collapse) based on the flow of air impinging on the circular components 330A-C (e.g., positive or negative flow). While the disclosure illustrates the cooling of a data storage enclosure, in other embodiments the cooling assembly 300 may be used to other types of enclosures such as enclosures that feature electronics other than data storage devices (e.g., processors, power supply units). Further, in the open position, the circular components 330A-C can block or otherwise reduce the amount of air-mover-generated acoustic energy that exits the cooling assembly 300.

Figure 11:
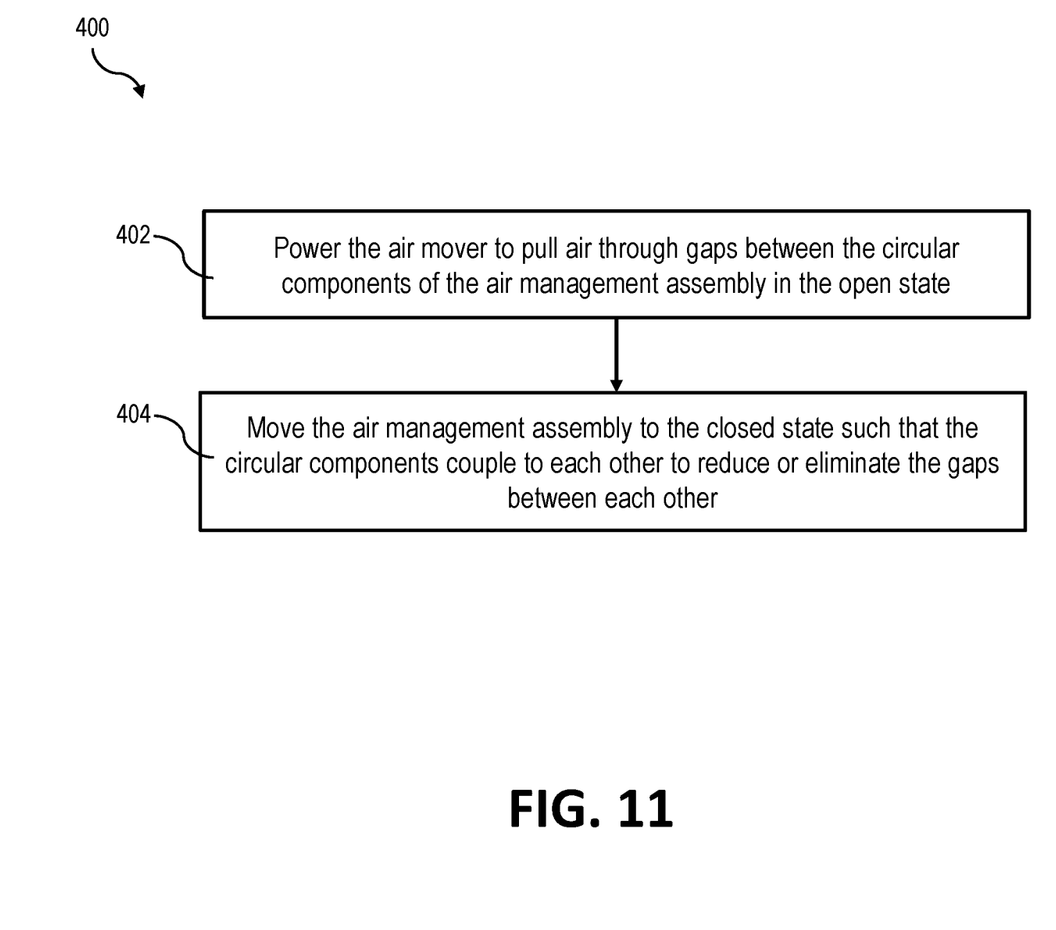
FIG. 11 shows a block diagram of steps of a method, in accordance with certain embodiments of the present disclosure.

FIG. 11 shows a block diagram of a method 400 for using the cooling assembly 300 described above. The method 400 includes powering the air mover 302 to pull air through the gaps 346A-C between the circular components 330A-C in the open position (block 402 in FIG. 11). The method 400 also includes moving the air management assembly 328 to the closed position such that the circular components 330A-C couple to each other to reduce or eliminate the gaps 346A-C between each other (block 404 in FIG. 11).

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

I claim:

1. A cooling assembly comprising:
an air mover assembly including an inlet;
an air management assembly coupled to the air mover assembly and including circular components arranged concentrically with respect to each other such that the circular components can move between an open position and a closed position, wherein in the open position, the circular components have gaps between each other and in the closed position, the circular components reduce or eliminate the gaps between each other.

2. The cooling assembly of claim 1, wherein the circular components include a first circular component with a first opening having a first opening diameter, a second circular component with a second opening having a second opening diameter, and a third circular component.

3. The cooling assembly of claim 2, wherein the second circular component has a second diameter that is greater than the first opening diameter.

4. The cooling assembly of claim 3, wherein the third circular component has a third diameter that is greater than the second opening diameter.

5. The cooling assembly of claim 2, wherein the second circular component has a second group of legs that extend through the first opening, wherein the third circular component has a third group of legs that extend through the first opening and the second opening.

6. The cooling assembly of claim 2, wherein the third component is cone-shaped.

7. The cooling assembly of claim 1, wherein the air management assembly includes a stopper structure, wherein the circular components include one or more legs that are arranged to be removably coupled to the stopper structure.

8. The cooling assembly of claim 1, wherein in the open position, the circular components direct air radially outward as the air passes through the gaps.

9. The cooling assembly of claim 1, wherein in the open position, the circular components are angled to deflect acoustic energy generated by the air mover assembly.

10. The cooling assembly of claim 1, wherein in the closed position, the circular components are positioned farther away along a rotational axis from the air mover assembly than in the open position.

11. The cooling assembly of claim 1, wherein in the closed position, portions of at least one of the circular components overlap with portions of an adjacent circular component.

12. The cooling assembly of claim 1, wherein in the closed position, the circular components are arranged to reduce backflow between the circular components.

13. The cooling assembly of claim 1, wherein the air mover assembly includes a front cover with the inlet, a back cover coupled to the front cover and including exhaust openings, and a fan unit positioned between the front cover and the back cover.

14. The cooling assembly of claim 13, wherein the fan unit is a radial fan unit.

15. A system comprising:
a first cooling assembly including:
a first air mover assembly including a first air mover, and
a first management assembly coupled to the first air mover assembly and including a first group of circular or ring-shaped components arranged concentrically with respect to each other such that the first group of circular or ring-shaped components can move between an open position to allow air to pass through the first management assembly and a closed position to reduce backflow through the first management assembly.

16. The system of claim 15, further comprising:
a second cooling assembly including:
a second air mover assembly including a second air mover, and
a second management assembly coupled to the second air mover assembly and including a second group of circular or ring-shaped components arranged concentrically with respect to each other such that the second group of circular or ring-shaped components can move between an open position to allow the air to pass through the second management assembly and a closed position to reduce backflow through the second management assembly.

17. The system of claim 16, further comprising:
an enclosure, wherein the first cooling assembly and the second cooling assembly are coupled to the enclosure.

18. The system of claim 17, wherein the first cooling assembly and the second cooling assembly are attached to a back wall of the enclosure.

19. The system of claim 17, wherein a majority of the first cooling assembly and the second cooling assembly are positioned outside the enclosure.

20. A method of using a cooling assembly including an air management assembly that is coupled to an air mover, that includes circular components arranged concentrically with respect to each other, and that can move between an open position and a closed position, the method comprising:
powering the air mover to pull air through gaps between the circular components of the air management assembly in the open position; and
moving the air management assembly to the closed position such that the circular components couple to each other to reduce or eliminate the gaps between each other.

* * * * *